United States Patent
Jacobsen

(10) Patent No.: US 6,933,715 B2
(45) Date of Patent: Aug. 23, 2005

(54) SENSOR SYSTEM FOR SENSING MOVEMENT

(75) Inventor: Stephen C. Jacobsen, Salt Lake City, UT (US)

(73) Assignee: Sarcos LC, Salt Lake City, UT (US)

(*) Notice: Subject to any disclaimer, the term of this patent is extended or adjusted under 35 U.S.C. 154(b) by 0 days.

(21) Appl. No.: 10/867,608

(22) Filed: Jun. 14, 2004

(65) Prior Publication Data

US 2004/0221658 A1 Nov. 11, 2004

Related U.S. Application Data

(60) Division of application No. 10/386,375, filed on Mar. 10, 2003, now abandoned, which is a division of application No. 08/744,381, filed on Nov. 7, 1996, now Pat. No. 6,531,861, which is a division of application No. 08/480,018, filed on Jun. 7, 1995, now Pat. No. 5,594,330, which is a division of application No. 07/898,216, filed on Jun. 12, 1992, now Pat. No. 5,481,184, which is a continuation-in-part of application No. 07/816,628, filed on Dec. 31, 1991, now Pat. No. 5,269,882, which is a continuation-in-part of application No. 07/647,659, filed on Jan. 28, 1991, now Pat. No. 5,106,455.

(51) Int. Cl.$^7$ .......................... G01R 19/32; C21C 5/48
(52) U.S. Cl. ................... 324/106; 324/158.1; 73/849
(58) Field of Search ............................ 324/106, 158.1, 324/73.1; 250/306–307; 310/316–317, 328–329; 434/253, 60; 73/763–780, 862.631, 862.68, 514.34, 849

(56) References Cited

U.S. PATENT DOCUMENTS

| | | |
|---|---|---|
| 3,780,817 A | 12/1973 | Videon |
| 3,914,993 A | 10/1975 | Babcock |
| 4,046,005 A | 9/1977 | Goroski |
| 4,232,265 A | 11/1980 | Smirnov |
| 4,555,955 A | 12/1985 | Morgan et al. |
| 4,628,745 A | 12/1986 | Hatamura |
| 4,640,139 A | 2/1987 | Fritz |
| 4,744,252 A | 5/1988 | Stout |
| 4,767,973 A | 8/1988 | Jacobsen et al. |
| 4,876,524 A | 10/1989 | Jenkins |
| 4,906,192 A | 3/1990 | Smithhard et al. |
| 4,928,030 A | 5/1990 | Culp |
| 4,964,306 A | 10/1990 | Jacobsen et al. |
| 5,056,370 A | 10/1991 | Maier |
| 5,106,455 A | 4/1992 | Jacobsen et al. |
| 5,266,801 A | 11/1993 | Elings et al. |
| 5,269,882 A | 12/1993 | Jacobsen |
| 5,270,485 A | 12/1993 | Jacobsen |
| 5,273,622 A | 12/1993 | Jacobsen |
| 5,402,684 A | 4/1995 | Engeler et al. |
| 5,481,184 A | 1/1996 | Jacobsen |
| 5,594,330 A | 1/1997 | Jacobsen |
| 5,672,929 A | 9/1997 | Gutsell et al. |
| 5,744,947 A | 4/1998 | Jacobsen et al. |
| 5,747,692 A | 5/1998 | Jacobsen et al. |
| 5,747,993 A | 5/1998 | Jacobsen et al. |
| 5,769,389 A | 6/1998 | Jacobsen et al. |
| 5,933,002 A | 8/1999 | Jacobsen et al. |
| 6,531,861 B1 * | 3/2003 | Jacobsen et al. ............ 324/106 |

* cited by examiner

Primary Examiner—Vinh P. Nguyen
(74) Attorney, Agent, or Firm—Crompton, Seager & Tufte LLC

(57) ABSTRACT

A system for sensing movement comprising an elongate object having a restrained end and an unrestrained end which is free to move in at least two degrees of freedom in response to an applied force, the unrestrained end of the elongated object being configured to move in response to the applied force. An electrically conductive element is disposed on the elongate object and is configured to cooperate with the elongate object in producing a signal usable to determine the magnitude and direction of the movement of the unanchored end due to the applied force. Sensing circuitry is electrically coupled to the electrically conductive element and is configured for processing the signal from the electrically conductive element so as to determine a magnitude and a direction of deformation and produce a signal indicative of the magnitude and direction.

2 Claims, 3 Drawing Sheets

SENSOR SYSTEM FOR SENSING MOVEMENT

This application is a DIV of U.S. patent application Ser. No. 10/386,375, filed Mar. 10, 2003 ABN, which is a divisional of U.S. patent application Ser. No. 08/744,381, filed Nov. 7, 1996, now issued as U.S. Pat. No. 6,531,861; which is a DIV of U.S. patent application Ser. No. 08/480,018 filed Jun. 7, 1995, now issued as U.S. Pat. No. 5,594,330; which is a DIV of U.S. patent application Ser. No. 07/898,216 filed Jun. 12, 1992, now issued as U.S. Pat. No. 5,481,184; which is a CIP of U.S. patent application Ser. No. 07/816,628 filed Dec. 31, 1991, now issued as U.S. Pat. No. 5,269,882; which is a CIP of U.S. patent application Ser. No. 07/647,659 filed Jan. 28, 1991, now issued as U.S. Pat. No. 5,106,455.

BACKGROUND OF THE INVENTION

This invention relates to systems for effecting movement of an object and, in desired applications, sensing the movement of objects, especially of micro-structures.

With recent developments in non-planar lithography, the fabrication of micro-structures, including both three-dimensional mechanical parts and three-dimensional electrical components, has become more readily achievable. See, for example, U.S. Pat. No. 5,106,455 and co-pending application, Ser. No. 816,628, filed Dec. 12, 1991. Such micro-structures are finding use in a variety of areas including medical devices, robotics, navigation equipment, motors and similar equipment. It is oftentimes desired in such applications to cause the controlled movement of very small mechanical parts, such as fibers or filaments, and also to detect the movement of mechanical parts, both the degree or extent of such movement and the direction.

SUMMARY OF THE INVENTION

It is an object of the invention to provide systems for effecting movement in micro-structural elements.

It is also an object of the invention to provide systems for detecting or sensing movement of micro-structural elements, including the degree and direction of such movement.

It is a further object of the invention to provide such systems which are especially adapted for effecting movement of micro fibers or micro filaments, and for sensing movement therein.

The above and other objects of the invention are realized in a specific illustrative embodiment of a movement actuator which includes an elongate fiber, and one or more strips of actuable material disposed on the surface of the side of the fiber. The actuable material is responsive to an actuation signal for changing its shape to thereby cause the fiber to move to accommodate the change in shape of the material. An actuation signal generator is also provided for selectively applying actuation signals to the strip or strips of actuable material to cause them to change shape and thereby cause the fiber to move as desired.

The strips of actuable material may be placed lengthwise on the fiber and caused to shorten to thereby cause the fiber to bend. Alternatively, the strips may be placed helically about the fiber and again caused to shorten to thereby cause the fiber to twist. Other patterns for the strips of actuable material may also be provided to cause various kinds of movements of the fiber.

The strips of actuable material may be so-called shape memory alloys which change from one shape to another when external heat or an electrical current which causes heat to be generated internally, is applied thereto. When the heat or electrical current is removed and the internally generated heat dissipates, the strips then return to their original shape. Alternatively, the strips of actuable material may be comprised of bimetals, i.e., two layers of different metals with different coefficients of thermal expansion, so that when heated, the strips are caused to change shape and thereby cause movement of the fiber.

In accordance with one aspect of the invention, the fibers may be made of a piezoelectric material and the strips of actuable material may consist of conductive elements positioned on the side of the fiber so that as voltage signals are applied to the conductive elements, the fiber is caused to bend. Various patterns of conductive elements could be provided to cause bending of the fiber, shortening or lengthening of the fiber, etc.

Alternatively, flexible fibers may be coated with piezoelectric strips so that when voltages are applied to the strip the strips bend and cause the fiber to bend.

BRIEF DESCRIPTION OF THE DRAWINGS

The above and other objects, features and advantages of the invention will become apparent from a consideration of the following detailed description presented in connection with the accompanying drawings in which.

DETAILED DESCRIPTION

Figure 1A:
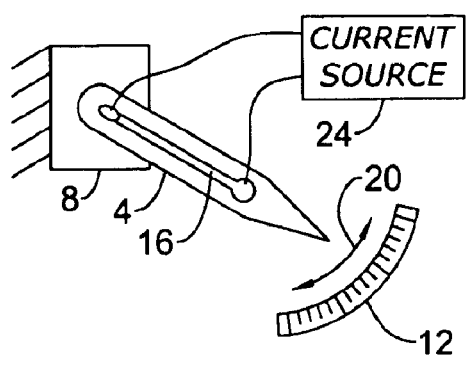
FIGS. 1A and 1B show schematic, perspective views of two embodiments of an actuator for causing movement of a rod or filament, utilizing shape memory alloys, made in accordance with the principles of the present invention.

Referring to FIG. 1A, there is shown a schematic, perspective view of one embodiment of a movement actuator made in accordance with the present invention. The actuator is comprised of a rod 4 (the terms "rod", "bar", "fiber" and "filament" are used interchangeably herein to indicate an elongate element). The bar 4 is attached or anchored at one end to a fixed support 8, with the other end being free to move in accordance with the present invention. The other end is shown to be pointed and is positioned adjacent a scale 12 to indicate where on the scale the free end of the bar is pointing. Disposed on one side of the bar 4 is a strip 16 of shape memory alloy which has the capability of changing its shape upon the application of external heat or electric current (which generates internal heat) to some other shape and then assuming the original shape when cooled or electric current is removed and the heat dissipates. Example of such shape memory alloy is nitonol comprised of about 50 percent nickel and 50 percent titanium. The bar 4 is made of a laterally flexible material such as ceramic, metal or plastic, so that when the shape memory alloy strip 16 is caused to change shape, such as contract along its length, the bar will be caused to bend as indicated by the double headed arrow 20.

An electrical current source 24 is coupled to the strip of shape memory alloy 16 to selectively supply electrical current thereto to cause the strip to change its shape. The amount of current supplied to the strip 16 determines the degree to which the strip changes shape and thus the degree to which the rod 4 is bent or deflected.

An alternative to use of the strip of shape memory alloy 16 is the use of a bimetal laid down in the same location as the strip 16 on the bar 4. A bimetal is comprised of two layers of different metals having different thermal coefficients of expansion. Thus, when heat or an electrical current is supplied to the bimetal strip it is caused to bend to, in turn, cause the bar 4 to bend. Bimetals are well known. Still another alternative is the use of piezoelectric strips on the bar 4 to cause bending of the bar in response to applied voltages.

Although the diameter of the bar 4 is shown to be relatively large compared to the length, these proportions are used for purposes of illustration only and it should be understood that generally the diameter would be much smaller compared to the length, and would more often resemble a thin fiber or filament, such as the fibers used in fiber optic applications. The strip of shape memory alloy 16 could be deposited upon the bar 4 using techniques disclosed in co-pending patent application, Ser. No. 07/816,628, filed Dec. 31, 1991.

Figure 1B:
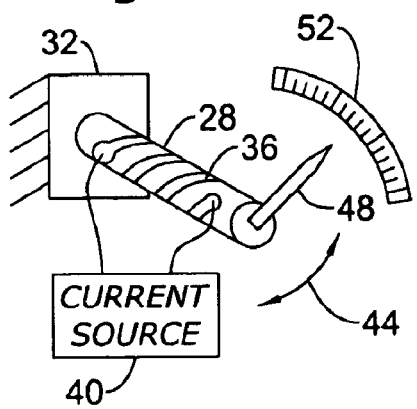

FIG. 1B shows a schematic, perspective view of another actuator having a rod 28 anchored at one end in a base 32 and having a strip of shape memory alloy 36 disposed in a helical pattern around the rod. When a current source 40 selectively supplies electrical current to the strip 36, the strip is caused to contract (or elongate) to thereby cause the free end of the bar 28 to twist or rotate as indicated by the double headed arrow 44. A pointer 48 is mounted on the free end of the bar 28 to indicate by a scale 52 the amount of rotation occurring at the free end.

It will be evident that a variety of shape memory alloy patterns could be provided on the side exterior of rods or filaments to cause the rods or filaments to bend, elongate, twist, contract, etc. For example, if a strip of shape memory alloy is disposed on a bar to extend from near the anchor end longitudinally and partially circumferentially about the bar, the bar may be caused to both bend and twist.

Figure 2A:
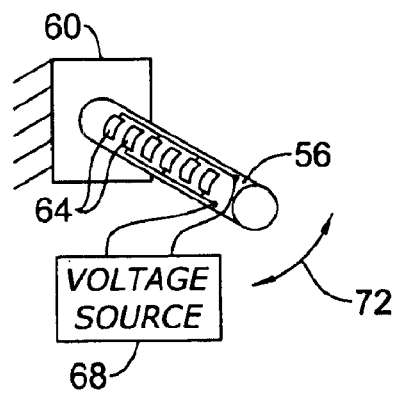
FIGS. 2A and 2B show schematic, perspective views of two embodiments of actuators for causing movement of a rod or filament, utilizing piezoelectric materials.
Figure 2B:
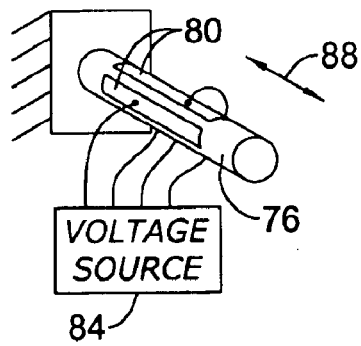

FIGS. 2A and 2B show two embodiments of movement actuators utilizing piezoelectric material. FIG. 2A is a schematic, perspective view of such a movement actuator having an elongate bar 56 anchored at one end to a base 60, and being made of a piezoelectric material such as PZT. Disposed on one side of the bar 56 in a longitudinal array are a plurality of electrically conductive elements or electrodes 64. A voltage source 68 selectively supplies a voltage of one polarity to alternate ones of the elements 64 and a voltage of opposite polarity to the remaining elements to thereby produce a localized electric field which will cause the bar 56 to bend as generally indicated by the double headed arrow 72. Piezoelectric materials, of course, are well known to change shape physically in response to application of electrical voltages and to produce electrical voltages when distorted, squeezed, bent, etc.

FIG. 2B shows an alternative embodiment of a movement actuator again utilizing an elongate bar 76 made of a piezoelectric material. In this embodiment, conductive strips 80 (only two of which are shown in FIG. 2B with two others not shown being formed on the other side of the bar) are disposed to extend longitudinally on the bar 76. A voltage source 84 selectively supplies voltage signals to the strips 80 to establish electric fields in the bar 76 to cause the bar to contract or extend longitudinally as indicated by the double headed arrow 88.

Figure 2C:
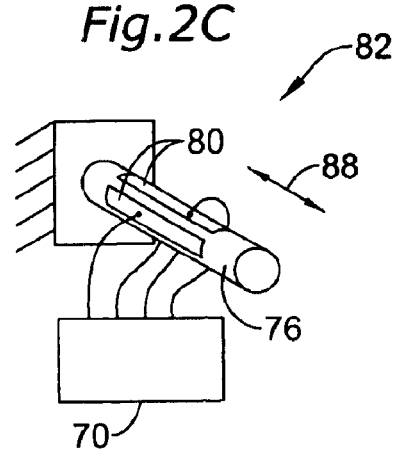

It should be noted that both configurations in FIGS. 2A and 2B could be adapted to be movement sensors 82 by simply replacing the voltage sources 68 and 84 with sensing circuitry 70 as shown in FIG. 2C. Then, when the piezoelectric bars 56 and 76 were bent or longitudinally compressed respectively, voltages would be developed in the bars and these voltages would be detected by the sensing circuitry 70 to thereby sense movement of the respective bars.

Figure 3:
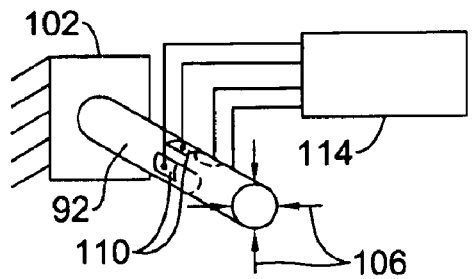
FIG. 3 is a schematic, perspective view of a sensor system for sensing movement, both the degree and direction, of a rod or filament, in accordance with the present invention.

FIG. 3 is a schematic, perspective view of a sensor system for sensing movement, including determination of the degree of movement and the direction of movement, of a flexible rod 92. The rod 92 is anchored at one end in a base 102 so that the free end of the rod is subject to forces in various directions indicated by the arrows 106. Disposed circumferentially about the bar 92 are four strain gauges 110, such as those disclosed in U.S. Pat. No. 4,964,306. The strain gauges 110 produce signals whose magnitudes are an indication of the degree of strain occurring at the location of the strain gauges. Thus, as a force is applied to the free end of the rod 92, to cause it to bend, the bar strains differently at different circumferential locations about the rod and these strains, at least at the location of the strain gauges 110, are detected and signals indicating the amount of strain are supplied to a microprocessor 114. The microprocessor 114, in turn, calculates the direction of bending of the rod 92 and the degree of the bend, from the magnitude of the signals received from the four strain gauges 110. The use of three or more strain gauges spaced circumferentially about the rod 92 are sufficient to determine the direction and degree of bend of the rod. This is because when the rod 92 is bent, there will always be at least one strain gauge which is subject to compression (being more on the side of the rod in the direction of the bend), and one strain gauge will be subject to expansion (being on the side of the rod more away from the direction of the bend). The strain gages are preferably disposed in substantially perpendicular directions so as to detect strain about orthogonal axes of the elongate member.

Figure 4:
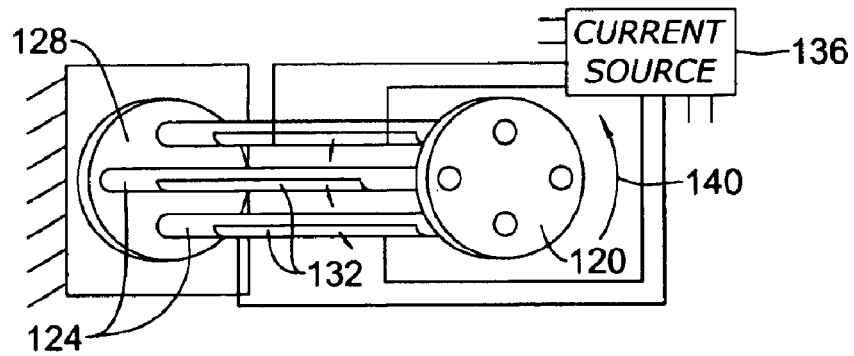
FIG. 4 is a schematic, perspective view of an actuator for causing rotational movement of an object.

FIG. 4 is a schematic, perspective view of an actuator for causing rotational movement of an object, in this case a disk 120. The actuator includes four flexible bars 124 having fixed ends attached to a base 128 at circumferentially spaced-apart locations. The bars 124 extend outwardly from the base 128, generally in parallel with one another, to join the disk 120. Strips of shape memory alloy 132 are disposed on the rods 124 on sides in line with the circumferential spacing of the rods, as shown, and the strips are each coupled to a current source 136. When current is applied to the strips 132, the strips cause the rods 124 to bend in a direction in line with the circumferential spacing to thereby cause the disk 120 to rotate in the direction indicated by the arrow 140.

Figure 5:
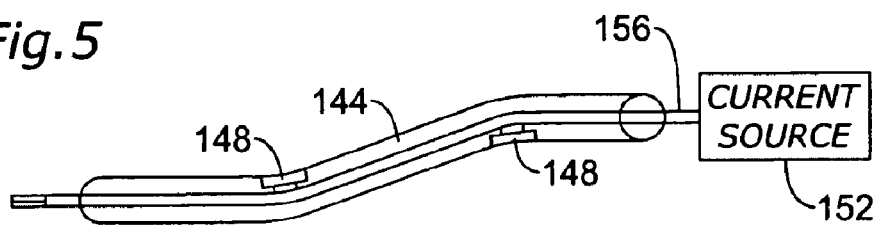
FIG. 5 is a schematic, perspective view of an actuator for causing the bending of a rod or filament at several locations along the length thereof.

FIG. 5 shows a flexible elongate rod 144 with shape memory alloy patches 148 disposed at longitudinally spaced-apart locations along the bar. A current source 152 is coupled by way of a buss 156 to each of the patches 148 to selectively supply current thereto. Thus, the bar 144 can be caused to bend at various locations along the length thereof as determined by the current source 152.

Figure 6:
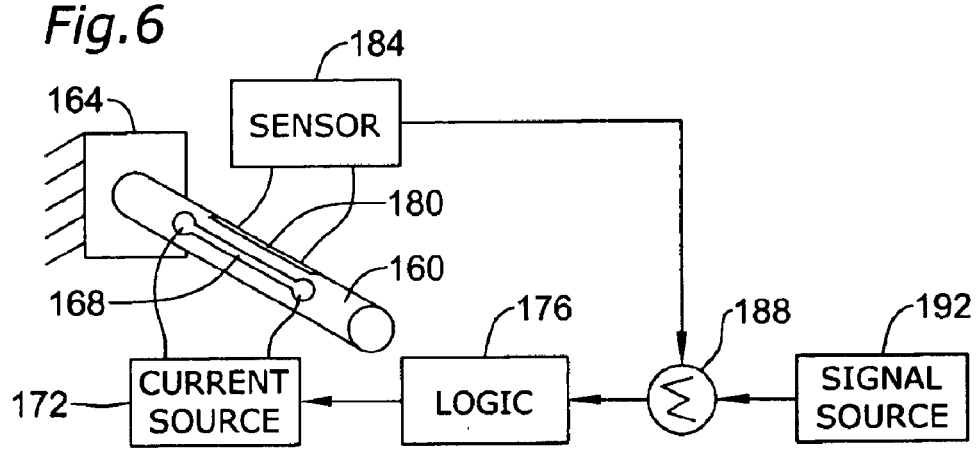
FIG. 6 is a schematic, perspective view of a feedback control system for causing controlled bending of a rod or filament.

FIG. 6 shows a feedback control system for effecting controlled bending of a flexible rod 160 anchored at one end to a base 164. Disposed on one side of the rod 160 is a strip of shape memory alloy 168 coupled to a current source 172 which operates to supply current to the strip 168 under control of a logic unit 176. Disposed on the other side of the bar 160 is a strain gauge 180 coupled to a sensor circuit 184. The sensor circuit 184 produces a signal whose magnitude is indicative of the strain to which the bar 160 is subjected and this signal is supplied to a summing circuit 188. A signal source 192 also supplies a signal to the summing circuit 188 in which the signal's value represents a degree of bending desired for the rod 160. The summing circuit 188 effectively compares the two input signals and if there is a difference, it signals the logic circuit 176 as to the amount of this difference and the logic circuit, in turn, signals the current source to cause further bending (or unbending) of the rod 160 so that the output signal of the sensor 184 will move closer in value to the signal supplied by the signal source 192. This is a conventional feedback control circuit for ensuring that a result represented by an input signal is more accurately achieved, the result in this case being the bending of the rod 160.

Figure 7:
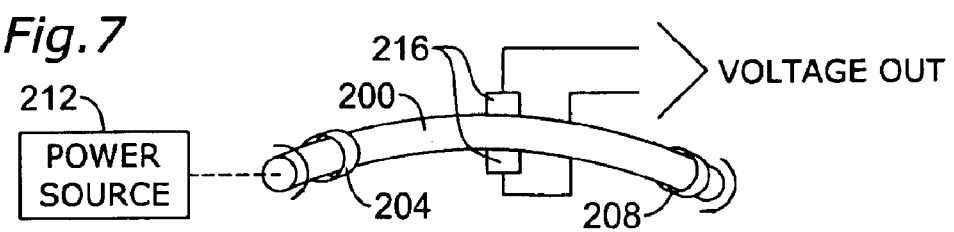
FIG. 7 is a schematic, perspective view of an electrical generator for generating electricity from a piezoelectric rod or filament.

FIG. 7 is a schematic, perspective view of an electricity generator composed of an elongate, flexible piezoelectric filament 200 disposed and held in place by bearings 204 and 208 located at the ends of the filament so that the filament follows an arc-shaped locus of points. A power source 212 is coupled to the filament 200 to cause the filament to rotate about an axis coincident with the arc-shaped locus of points. As a result, the filament 200 is continually stressed and compacted (that portion of the rod on the concave side of the arc being compacted and that portion of the rod on the convex side of the arc being stressed) to thereby develop voltages which are supplied to wiper elements or electrodes 216 disposed on opposite sides of the filament. In this manner, electrical voltage, and thus electrical current, may be developed or generated from a mechanical rotation of the piezoelectric filament 200. Conversely, by supplying an appropriately commutated voltage to the elements 216, the filament 200 can be caused to rotate and thus operate as a motor.

Figure 8:
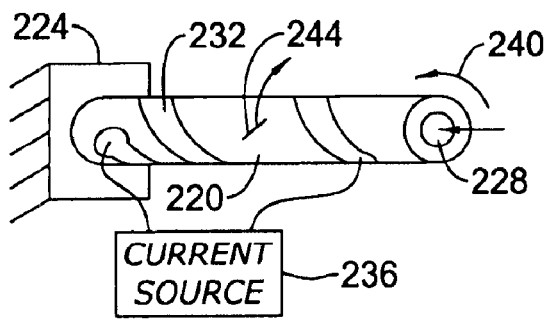
FIG. 8 is a schematic, perspective view of a slit tube valve made in accordance with the principles of the present invention.
Figure 9:
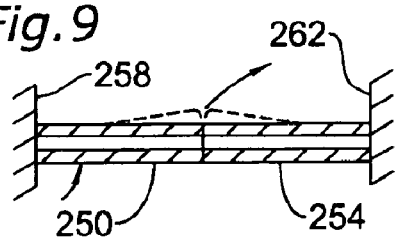
FIG. 9 is a side, cross-sectional view of a valve, utilizing two tubes, made in accordance with the present invention.
Figure 10:
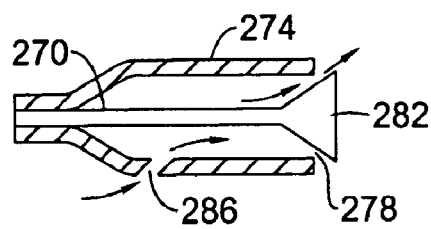
FIG. 10 is a side, cross-sectional view of another embodiment of a valve, utilizing a bendable rod or filament, in accordance with the present invention.

FIGS. 8–10 show three different embodiments of a valve using the technology of the present invention. In FIG. 8, a flexible tube 220 is shown attached at a closed end to a base 224, and having an open end 228 for receiving a fluid. A strip of shape memory alloy 232 is helically disposed about the exterior of the tube 220 and is coupled to a current source 236 which, by supplying current to the strip 232, selectively causes a change in shape of the strip to thereby cause a twisting of the tube 220 in the direction indicated by the arrow 240. When the tube 220 is twisted as indicated, a slit 244 formed in the side of the tube is caused to open to allow the outflow of fluid. When the tube 220 is untwisted, the slit 244 is closed to prevent the outflow of fluid. In this manner, the flow of fluid through and out the tube 220 can be controlled by controlling the twisting of the tube. The tube 220 could be made of a resilient ceramic or hard rubber.

FIG. 9 shows another embodiment of a valve utilizing the present invention. In this embodiment, two flexible tubes 250 and 254 are anchored respectively on bases 258 and 262. The free ends of the tubes are positioned to mate together in a colinear fashion to seal the inside of the tubes from the outside when the tubes are undeflected. An access port 266 is formed in the tube 250 to allow introduction of fluid to the inside of the tubes. Of course, such access could be provided through the other tube 254 or through the bases 258 or 262. Strips of shape memory alloy are disposed on the upper sides of the tubes 250 and 254 and are selectively heated by a current source to cause the tubes to deflect or bend upwardly, as indicated by dotted lines in FIG. 9. When such deflection occurs, the ends of the tubes 250 and 254 are exposed to allow escape of fluid which has been introduced into the insides of the tubes. The flow of fluid through the valve of FIG. 9 is indicated by the arrows. When current to the strips of shape memory alloy is terminated so that the strips cool, the strips return to their original shape causing the tubes to deflect back to their original colinear position to again seal the inside of the tubes from the outside and prevent further outflow of fluid.

FIG. 10 shows a cross-sectional, elevational view of a third embodiment of a valve which, in this case, utilizes a selectively bendable rod 270 disposed to extend from a closed end of a housing 274 towards an open end 278. A conical cap 282 is disposed on the end of the bar 270 and is positioned in the open end 278 of the housing 274. The diameter of the conical cap 282 is greater than the opening in the open end 278 of the housing 274 so that if the cap is moved towards the closed end of the housing, it seats in the open end to seal off the inside of the housing from the outside. Fluid is introduced into the inside of the housing 274 through an inlet port 286. The bar 270 is made of a piezoelectric material and conductive strips are disposed on the sides of the bar (not shown) so that when a voltage is supplied thereto, the bar is caused to selectively lengthen or shorten depending upon the polarity of the voltages. When the bar 270 is caused to shorten, the conical cap 282 is caused to seat on and close off the opening at the open end 278 of the housing 274 to prevent the outflow of fluid. When the bar 270 is caused to lengthen, the conical cap 278 is moved outwardly from the opening to allow the outflow of fluid from inside the housing 274, as indicated by the arrows.

Figure 11:
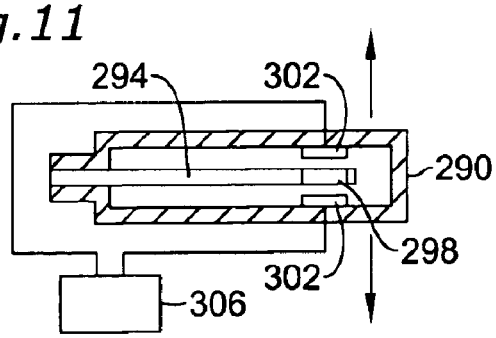
FIG. 11 is a side, cross-sectional view of an accelerometer, made in accordance with the principles of the present invention.
Figure 12:
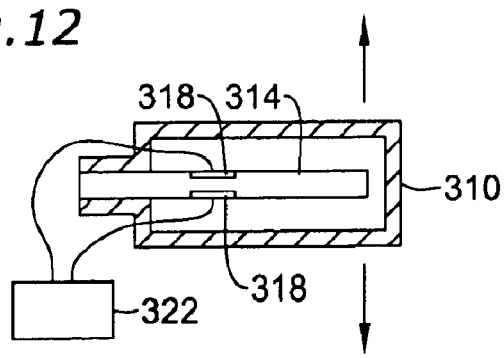
FIG. 12 is a side, cross-sectional view of another embodiment of an accelerometer, also made in accordance with the principles of the present invention.

FIGS. 11 and 12 show side, cross-sectional views of two embodiments of an accelerometer made in accordance with the present invention. In FIG. 11, the accelerometer is shown to include a housing 290 in which is disposed a flexible rod 294, one end of which is fixed at one end of the housing 290 to extend toward the other end of the housing as shown. Disposed on the free end of the rod 294 is a field emitter 298 for developing an electric field which emanates radially outwardly. Disposed on the interior of the housing 290 circumferentially about the field emitter 298, but spaced therefrom, are a plurality of field detectors 302. The field detectors 302 are coupled to a signal processor 306 for determining which of the field detectors 302 is producing the strongest signal, indicating that the field emitter 298 is closest to that field detector. When the housing 290 is accelerated, the rod 294 is caused to deflect in the direction opposite the acceleration to move the field emitter 298 closest to one of the plurality of field detectors 302, and the signal processor 306 determines which field detector that is and therefore in which direction the acceleration is occurring. Also, the degree of deflection by the rod can be determined by the strength of the electric field detected and this provides an indication of the magnitude of the acceleration. The use of field emitters and field detectors for sensing movement is well known. See U.S. Pat. No. 4,767, 973.

FIG. 12 shows a side, cross-sectional view of another embodiment of an accelerometer which also includes a housing 310 in which is disposed a piezoelectric rod 314 extending from one end of the housing toward the other end. Disposed about the sides of the rod 314 are a plurality of electrically conductive elements 318 for conducting to a signal processor 322 voltages developed in the rod 314 when it is deflected. Such voltages would be developed when the housing 310 were accelerated in a direction lateral of the housing 310 and the amount of voltage developed would provide an indication of the degree of deflection of the rod 313 and thus of the magnitude of the acceleration. Also, the polarity of the voltages developed at each of the electrically conductive elements 318 would provide an indication of the direction of the acceleration.

It is to be understood that the above-described arrangements are only illustrative of the application of the principles of the present invention. Numerous modifications and alternative arrangements may be devised by those skilled in the art without departing from the spirit and scope of the present invention and the appended claims are intended to cover such modifications and arrangements.

What is claimed is:

1. A system for sensing movement comprising:
an elongate object having a first restrained end and a second unrestrained end, the unrestrained end being free to move in at least two degrees of freedom in response to an applied force;
an electrically conductive element secured to the elongate object, the electrically conductive element comprising a piezoelectric material configured to produce an electrical potential upon deformation of the material by the applied force, the electrically conductive element configured so that as the elongate object deforms the piezoelectric material deforms, whereby an electrical signal indicative of the magnitude of deformation is produced enabling feedback control of deformation of the elongate object; and
sensing circuitry electrically coupled to the electrically conductive element, the sensing circuitry configured to cooperate with the elongate object in producing a signal usable to determine the magnitude and direction of deformation of the elongate object.

2. A system for sensing movement comprising:
an elongate object including a first restrained end and a second unrestrained end, the unrestrained end being free to move in at least two degrees of freedom in response to an applied force, the elongate object comprising a piezoelectric material configured to produce an electric field indicative of deformation of the elongate object by the applied force;
an electrically conductive element coupled to the elongate object configured to provide an electrical signal indicative of the electric field; and
sensing circuitry electrically coupled to the electrically conductive element configured to evaluate the electrical signal to determine the magnitude and direction of deformation of the elongate object.

* * * * *